United States Patent [19]

Eylon

[11] Patent Number: 5,682,242

[45] Date of Patent: Oct. 28, 1997

[54] METHOD AND APPARATUS FOR DETERMINING A LOCATION ON A SURFACE OF AN OBJECT

[75] Inventor: Dan Eylon, Tel Aviv, Israel

[73] Assignee: Nova Measuring Instruments Ltd., Israel

[21] Appl. No.: 512,731

[22] Filed: Aug. 7, 1995

[30] Foreign Application Priority Data

Jan. 11, 1995 [IL] Israel ........................................ 112313

[51] Int. Cl.⁶ .................................................. G01B 11/00
[52] U.S. Cl. ........................... 356/401; 356/399; 356/400; 250/548
[58] Field of Search .................................. 356/399–401; 355/43, 53, 77; 250/559.3, 548

[56] References Cited

U.S. PATENT DOCUMENTS

| | | | |
|---|---|---|---|
| 4,780,615 | 10/1988 | Suzuki | 250/548 |
| 4,823,012 | 4/1989 | Kosugi | 250/491.1 |
| 4,918,320 | 4/1990 | Hamasaki | 250/548 |
| 4,969,116 | 11/1990 | Wada et al. | 364/578 |
| 5,037,771 | 8/1991 | Lipp | 437/51 |
| 5,238,354 | 8/1993 | Volovich | 414/779 |
| 5,241,266 | 8/1993 | Ahmad et al. | 324/158 |

*Primary Examiner*—Frank Gonzalez
*Assistant Examiner*—Michael P. Stafira
*Attorney, Agent, or Firm*—Skjerven, Morrill, MacPherson, Franklin & Friel

[57] ABSTRACT

A method is proposed for determining a location on an object and for positioning an object, such as a silicon wafer, which has an array of generally perpendicular grid lines on its surface and a plurality of directional features. The method determines the directions of the grid lines relative to the direction of a reference coordinate system, detects a grid junction and detects a direction of one of the plurality of directional features, thereby providing a location of the grid junction in the reference coordinate system. The object is positioned in accordance with the provided location of the grid junction.

25 Claims, 2 Drawing Sheets

METHOD AND APPARATUS FOR DETERMINING A LOCATION ON A SURFACE OF AN OBJECT

FIELD OF THE INVENTION

The present invention relates to system and method for determining a location on the surface of an object generally, and more particularly to system and method for determining a location on a semiconductor wafer.

BACKGROUND OF THE INVENTION

As is well known in the art, semiconductor chips, such as computer chips, are manufactured such that they include a substrate, typically a silicon wafer. It is often desired during the manufacturing process of silicon wafers to determine a location on the wafer for various purposes, such as quality control and subsequent cutting of the wafer into individual chips.

Silicon wafers, such as the ones manufactured by Intel Inc. or by International Business Machines (IBM) both of the USA, typically include discrete geometrical features and markings thereon, as shown in FIG. 1 to which reference is now made. FIG. 1 illustrates a silicon wafer, generally referenced 10, which is generally circular but includes a flat edge 11 or a notch (not shown) in one side thereof.

Prior art methods for determining the orientation of a silicon wafer typically include the step of detecting, by employing a sensor, the limits of the flat 11 or of the notch of the silicon wafer while the wafer rotates on a stage. These methods are both time consuming and require that the circumference of the wafer, or at least the side of the flat or the notch facing the sensor, will be unobscured. Furthermore, they are not applicable when the stage cannot be rotated.

SUMMARY OF THE INVENTION

It is an object of the present invention to provide an improved system and method for determining a location on a surface of an object, preferably a silicon wafer.

Further, it is an object of the present invention to provide an improved system and method for positioning an object, preferably a silicon wafer.

The objects of the present invention may be achieved by employing geometric features on the surface of an object, such as the features usually available on silicon wafers.

There is thus provided, in accordance with a preferred embodiment of the present invention a method for determining a location on an object having on its surface an array of generally perpendicular grid lines and a plurality of directional features. The method includes the following steps:

a. determining the directions of the grid lines relative to the direction of a reference coordinate system;

b. detecting a grid junction, the distance of the grid junction from the geometrical center of the surface being known; and c. detecting a direction of one of the plurality of directional features, thereby providing a location of the grid junction in the reference coordinate system.

There is also provided, in accordance with a preferred embodiment of the present invention a method for positioning an object having on its surface an array of generally perpendicular grid lines and a plurality of directional features. The method includes the following steps:

a. determining the directions of the grid lines relative to the direction of a reference coordinate system;

b. detecting a grid junction, the distance of the grid junction from the geometrical center of the surface being known;

c. detecting a direction of one of the plurality of directional features, thereby providing a location of the grid junction in the reference coordinate system; and d. positioning the object in accordance with the provided location of the grid junction.

Further, according to a preferred embodiment of the present invention the method includes, prior to the step of determining, the step of positioning the object on a support, the coordinate system of the support being the reference coordinate system, generally with the geometrical center of the surface coinciding with the origin of the support coordinate system, thereby assuring that the detected grid junction being one of grid junctions adjacent to the geometrical center of the surface.

Additionally, according to a preferred embodiment of the present invention the step of detecting the grid junction include the following steps:

a. moving the optical assembly in a direction coincident with one direction of the grid lines until a grid line extending perpendicular to the direction of movement is detected; and b. moving along the detected grid line until a grid junction is detected.

Further, according to a preferred embodiment of the present invention the step of detecting the direction of the grid lines and the step of detecting the grid junction also include the step of employing a correlation function between a representation of the surface of the object and a representation of a reference thereto. The representation may be one dimensional or two dimensional.

Further, according to a preferred embodiment of the present invention the directional feature is in the grid junction and the step of moving to a different grid junction provided that the directional feature is not detected in that junction.

Finally, in accordance with a preferred embodiment of the present invention the object is a silicon wafer, the grid lines are scribe lines between dies of the silicon wafer and the grid junction is a scribe line intersection.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention provides a system and a method for determining a location on an object and a system and a method for positioning an object, such as a silicon wafer. The present invention employs geometric features on the surface of an object, such as the features usually available on silicon wafers as described in more detail hereinbelow.

Figure 1:
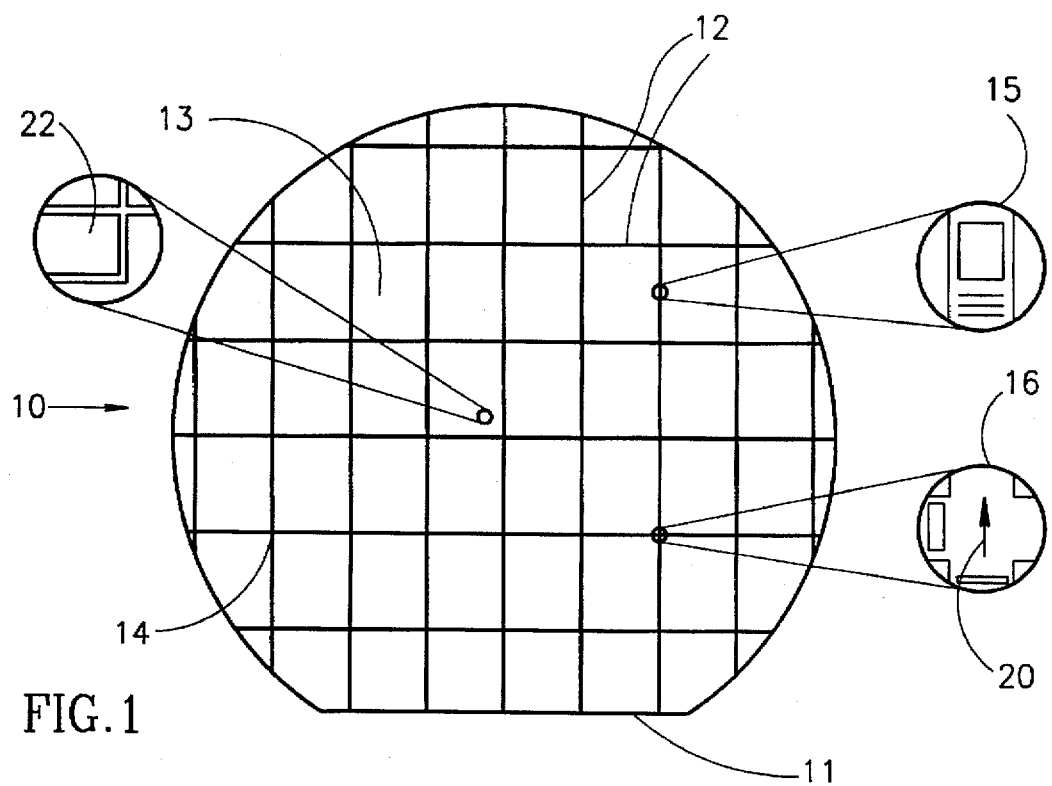
FIG. 1 is a schematic illustration of a prior art silicon wafer.

As illustrated in FIG. 1, silicon wafers, such as the silicon wafer 10, typically include a grid of scribe lines 12 which are generally perpendicular therebetween. The silicon wafer will eventually be cut along the scribe lines into dies, such as the die 13, which are the individual chips obtained from the wafer. The scribe lines typically include markings thereon, such as the black square and three lines shown in the blow up illustration 15.

The junctions between two scribe lines, such as the junction 14, may also include a characteristic marking, such as the arrow 20 shown in the blow up illustration 16.

Figure 2:
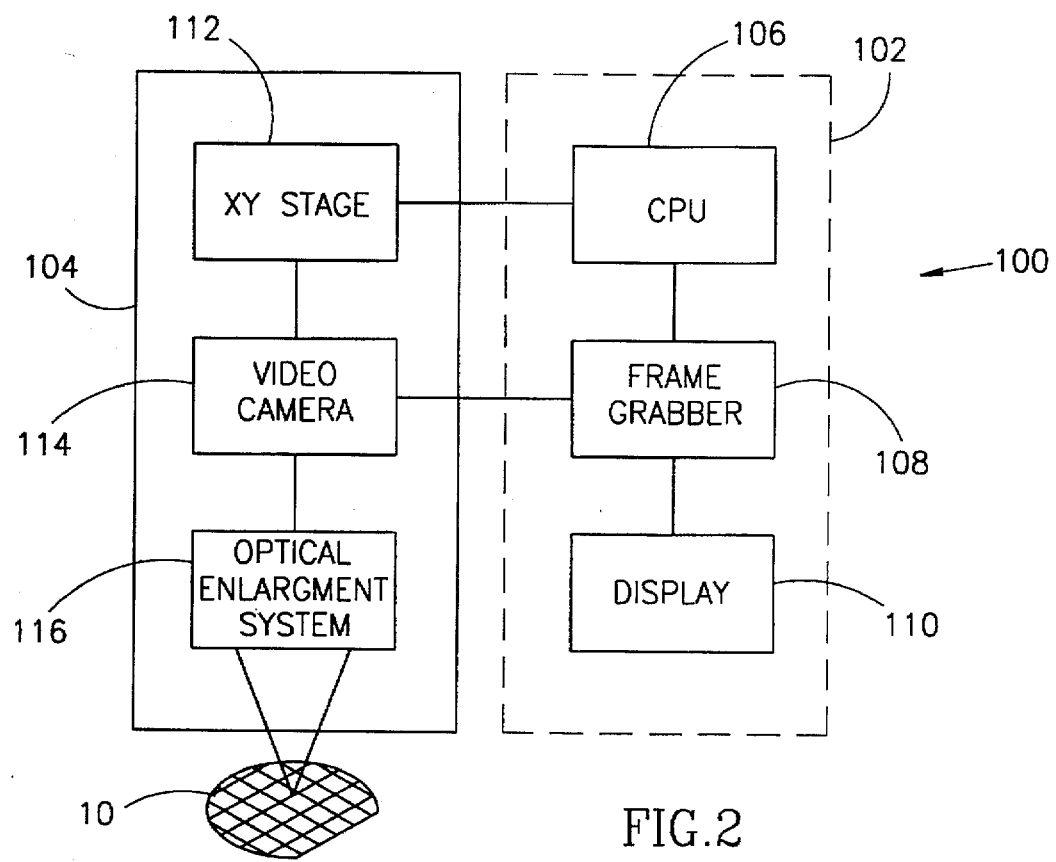
FIG. 2 is a schematic block diagram illustration of a system for positioning a silicon wafer constructed and operative in accordance with a preferred embodiment of the present invention.

Reference is now made to FIG. 2 which is a schematic block diagram illustration of a system for positioning a silicon wafer constructed and operative in accordance with a preferred embodiment of the present invention. The system, generally referenced 100, comprises a computer 102, such as a personal computer of the type manufactured by International Business Machines (IBM), and a moving optical assembly 104.

The computer 102 preferably includes a Central Processing Unit (CPU) 106, a frame grabber card 108, such as the Cortex-I frame grabber card, manufactured and sold by Imagenation of Beaverton, Oreg., U.S.A, and a display 110. Preferably, but not necessarily, the display 110 includes two displays, one for displaying input commands to the CPU 106 and a video display for displaying images.

The moving optical assembly 104 preferably includes an XY stage 112 to which a video camera 114 is connected and an optical enlargement system 116.

The optical enlargement system 116 preferably comprises a light source, such as a Xenon or a Halogen lamp, for illuminating the surface of the wafer 10, a microscope for providing a desired optical enlargement, such as a 10 fold enlargement, and a focusing assembly which moves the microscope away from or towards the wafer 10 in order to obtain a sharp focused image in the video camera 114.

The focusing assembly may also be connected to a motion system (not shown) by which the optical enlargement system 116 moves in order to obtain focus. The motion system may be controlled by the CPU 106.

According to one preferred embodiment of the present invention the system 100 operates to determine a desired location on a silicon wafer, such as the silicon wafer 10. An image of a selected portion of the silicon wafer 10, preferably of a relatively small area thereof, determined by the optical enlargement system is sensed by the video camera 114 and is provided to the CPU 106 via the frame grabber card 108. The CPU 106 analyzes the image and adjusts the position of the moving optical assembly 104 by moving the XY stage 112. The process, which is described in more detail hereinbelow, is then repeated until the desired location is found.

According to another preferred embodiment of the present invention, the system 100 operates to position the silicon wafer 10 in a desired position relative to any desired system such as a silicon wafer cutting system.

Figure 3:
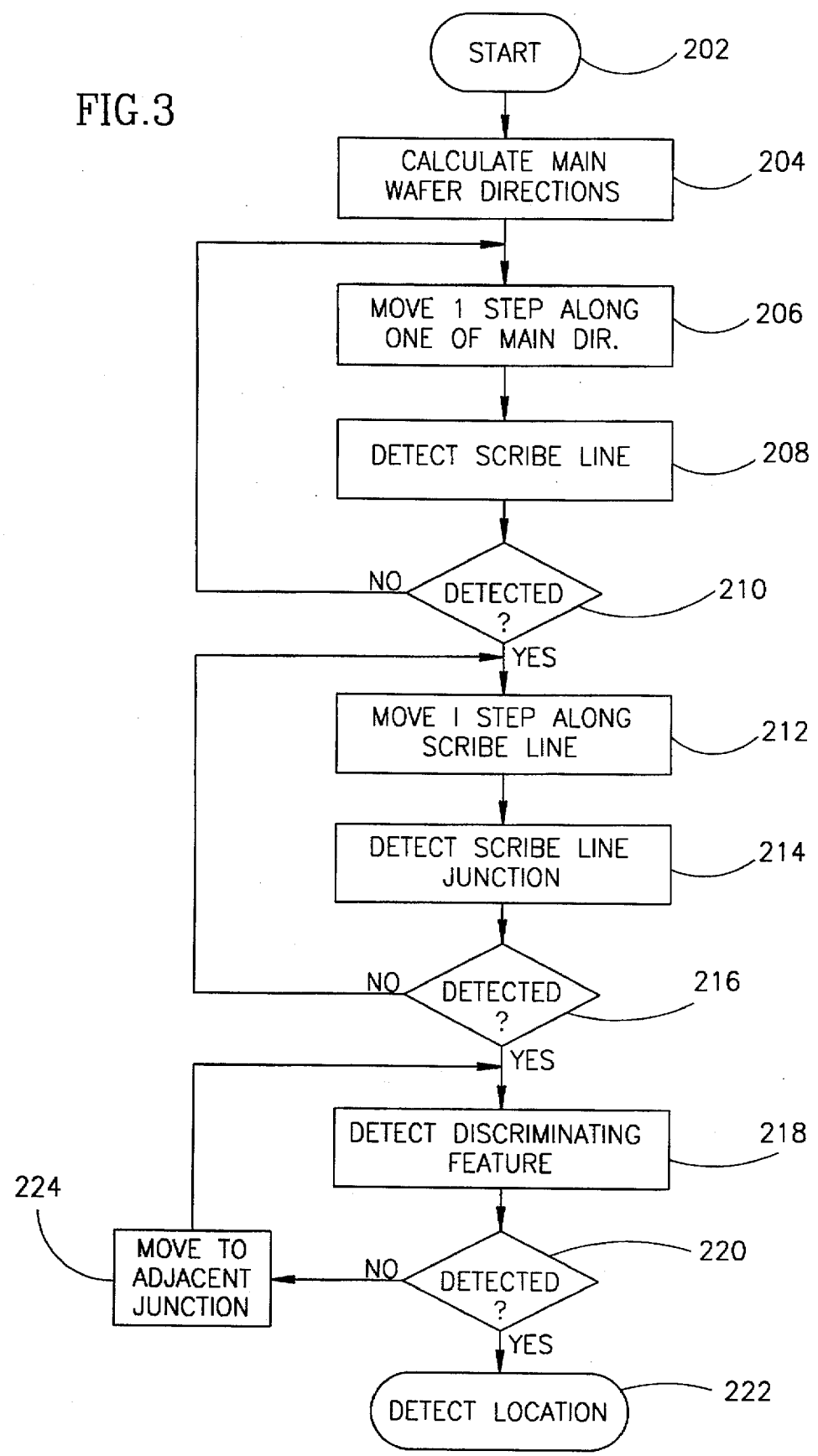
FIG. 3 is a flow chart illustration of a method for determining an exact location on a silicon wafer, in accordance with a preferred embodiment of the present invention.

Reference is now made to FIG. 3 which is a flow chart illustrating a method for determining a desired location on a silicon wafer, in accordance with a preferred embodiment of the present invention. The flow chart of FIG. 3 illustrates a method of employing the system of FIG. 2, in accordance with a preferred embodiment of the present invention. The method typically provides a detection accuracy of about 1 micron.

In order to employ the method of FIG. 3, the wafer 10 is positioned, for example by a user, on the stage of the system 100. This manual positioning provides the center of the silicon wafer with an inaccuracy of about 1 millimeter with respect to its stage or to the moving optical assembly.

It will be appreciated that, unlike in prior art methods and systems, the silicon wafer according to the present invention need not be rotated. Also, its circumference may be partially obscured.

The moving optical assembly 104 is then positioned above the center of the wafer, and the method according to the present invention is initiated as indicated by block 202.

It is noted that the stage of the silicon wafer and the moving optical assembly preferably include a coordinate system. Preferably, the coordinate system is a cartesian coordinate system having its origin coincident with the center of the stage.

According to the method of FIG. 3, the main directions of the silicon wafer 10, i.e. the direction of the scribe lines, are determined first (step 204), preferably relative to the stage coordinate system. The orientation may be expressed as an angle of rotation relative to the stage coordinate system.

The relative orientation of the scribe lines relative to the stage coordinate system may be determined by any suitable method which employs the fact that most of the elements on the wafer surface are bounded by lines which are generally straight and are generally parallel to the main directions of the silicon wafer 10.

According to a preferred embodiment of the present invention, a Hough transform is employed on the grabbed image to obtain the content of the lines at any selected direction, thereby to detect which lines are scribe lines.

Once the direction of the scribe lines is determined, the moving optical assembly 104 is moved one step at a time along one of the main directions of the scribe lines as indicated by the loop referenced 206, 208 and 210, until a perpendicular scribe line thereto is detected.

It will be appreciated that typically, since the silicon wafer is positioned in the center of the stage, though with the insufficient accuracy of about 1 millimeter, and since the distance travelled by the optical moving assembly 104 is known, it can be determined whether the detected scribe line is one of the four scribe lines adjacent to the center of the wafer.

The scribe line can be detected by any suitable method for detecting a known feature in an image, such as by employing a correlation function between the image of the silicon wafer surface and a reference image stored in the computer 102. Alternatively, since the sizes of the dies are generally similar and the widths of the scribe lines are generally similar, the correlation may be performed between an enhanced image displaying only lines having a width generally similar to that of the scribe lines with a similar reference image.

According to one preferred embodiment of the present invention, the correlation is performed between a one dimensional function representing the features of the silicon wafer surface and a reference function. To obtain the one dimensional function representing the two dimensional image, intensity values of pixels along lines on the silicon wafer having the general direction of the scribe lines are summed and averaged, thereby providing an averaged intensity values of each of the lines. The averaged intensity value is then plotted against the line location on a base line perpendicular thereto, thereby providing a one dimensional function of the image. The intensity values are the grey scale values of a grey level image or the Red, Green, Blue (RGB) values of a color image.

The method continues in step 212 by moving the optical moving assembly 104 along the detected scribe line to a location of scribe lines intersection, also termed a "junction" (step 214).

The location of the junction can be detected by employing a second correlation function between an image, preferably a zoomed image of the junction, and a similar reference image stored in the computer 102. Alternatively, or in addition thereto, the junction can be detected by employing the correlation function procedures described hereinabove on two perpendicular scribe lines and determining the intersection therebetween.

The junction detected is one of the four junctions adjacent to the geometrical center of the silicon wafer. In order to determine which of the four junctions has been detected (step 216), thereby providing an exact location on the silicon wafer, the optical moving assembly searches for a discriminating feature (step 218), such as the arrow 20 of the junction 16 (FIG. 1). Preferably, one of four adjacent junctions, i.e. one of the corners of a die includes a discriminating feature.

As indicated by the block 220, if a discriminating feature is detected, the wafer is oriented vis a vis the coordinate system as indicated by block as indicated by block 222. The optical moving assembly can be moved to any desired location on the silicon wafer.

If a discriminating feature is not detected, as indicated by the block 224, the optical moving assembly is moved to an adjacent junction until a discriminating feature is detected. The loop indicated by blocks 218 and 220 is then repeated until a discriminating feature is detected.

It will be appreciated that the preferred embodiments described hereinabove are described by way of example only and that numerous modifications thereto, all of which fall within the scope of the present invention, exist. A non-limiting example is to fix the moving optical assembly 104 and to move the stage with the silicon wafer with respect thereto.

It will also be appreciated that the present invention is not limited to silicon wafers only. Rather, any of the embodiments described hereinabove and any modification thereof may be employed to detect a desired location of any surface having a grid and a discriminating feature in the grid junctions.

It will be appreciated by persons skilled in the art that the present invention is not limited by what has been particularly shown and described herein above. Rather the scope of the invention is defined by the claims which follow:

We claim:

1. A method for determining a location on an object, said object having on its surface an array of generally perpendicular grid lines and plurality of directional features, the method comprising the steps of:

a. determining the directions of said grid lines relative to the direction of a reference coordinate system;

b. detecting a grid junction, the distance of said grid junction from the geometrical center of said surface being known; and c. detecting a direction of one of said plurality of directional features, thereby providing a location of said grid junction in said reference coordinate system, wherein said step of determining includes, prior to said step of determining, a step of positioning said object on a support, the coordinate system of said support being said reference coordinate system, generally with the geometrical center of the surface coinciding with the origin of the support coordinate system, thereby assuring that said detected grid junction is one of the grid junctions adjacent to said geometrical center of said surface.

2. A method for determining a location on an object, said object having on its surface an array of generally perpendicular grid lines and plurality of directional features, the method comprising the steps of:

a. determining the directions of said grid lines relative to the direction of a reference coordinate system;

b. detecting a grid junction, the distance of said grid junction from the geometrical center of said surface being known; and c. detecting a direction of one of said plurality of directional features, thereby providing a location of said grid junction in said reference coordinate system, wherein said step of detecting said grid junction further comprises the steps of:

i) moving in a direction coincident with one direction of said grid lines until a grid line extending perpendicular to the direction of movement is detected; and ii) moving along said detected grid line until a grid junction is detected.

3. A method according to claim 1 wherein said step of determining said direction of said grid lines also comprises the step of employing a correlation function between a representation of the surface of said object and a representation of a reference thereto.

4. A method according to claim 3 wherein said representation is a two dimensional image.

5. A method according to claim 3 wherein said representation is a one dimensional function.

6. A method according to claim 1 wherein said directional feature is in said grid junction.

7. A method for determining a location on an object, said object having on its surface an array of generally perpendicular grid lines and plurality of directional features, the method comprising the steps of:

a. determining the directions of said grid lines relative to the direction of a reference coordinate system;

b. detecting a grid junction, the distance of said grid junction from the geometrical center of said surface being known; and c. detecting a direction of one of said plurality of directional features, thereby providing a location of said grid junction in said reference coordinate system, wherein said directional feature is in said grid junction, and also including the step of moving to a different grid junction provided that said directional feature is not detected in said junction.

8. A method according to claim 1 wherein said object is a silicon wafer.

9. A method according to claim 8 wherein said grid lines are scribe lines between dies of said silicon wafer and said grid junction is a scribe line intersection.

10. A method for positioning an object, said object having on its surface an array of generally perpendicular grid lines and a plurality of directional features, the method comprising the steps of:

a. determining the directions of said grid lines relative to the direction of a reference coordinate system;

b. detecting a grid junction, the distance of said grid junction from the geometrical center of said surface being known;

c. detecting a direction of one of said plurality of directional features, thereby providing a location of said grid junction in said reference coordinate system; and d. positioning said object in accordance with said provided location of said grid junction.

11. A method according to claim 10 wherein said step of determining includes, prior to said step of determining, a step of positioning said object on a support, the coordinate system of said support being said reference coordinate system, generally with the geometrical center of the surface coinciding with the origin of the support coordinate system, thereby assuring that said detected grid junction is one of the grid junctions adjacent to said geometrical center of said surface.

12. A method according to claim 10 wherein said step of detecting said grid junction comprising the steps of:

a. moving in a direction coincident with one direction of said grid lines until a grid line extending perpendicular to the direction of movement is detected; and b. moving along said detected grid line until a grid junction is detected.

13. A method according to claim 10 wherein said step of determining said direction of said grid lines also comprises the step of employing a correlation function between a representation of the surface of said object and a representation of a reference thereto.

14. A method according to claim 13 wherein said representation is a two dimensional image.

15. A method according to claim 13 wherein said representation is a one dimensional function.

16. A method according to claim 10 wherein said directional feature is in said grid junction.

17. A method according to claim 16 and also including the step of moving to a different grid junction provided that said directional feature is not detected in said junction.

18. A method according to claim 10 wherein said object is a silicon wafer.

19. A method according to claim 18 wherein said grid lines are scribe lines between dies of said silicon wafer and said grid junction is a scribe line intersection.

20. A method according to claim 2 wherein said step of determining said direction of said grid lines also comprises the step of employing a correlation function between a representation of the surface of said object and a representation of a reference thereto.

21. A method according to claim 2 wherein said representation is a two dimensional image.

22. A method according to claim 21 wherein said representation is a one dimensional function.

23. A method according to claim 2 wherein said directional feature is in said grid junction.

24. A method according to claim 2 wherein said object is a silicon wafer.

25. A method according to claim 24 wherein said grid lines are scribe lines between dies of said silicon wafer and said grid junction is a scribe line intersection.

* * * * *